(12) United States Patent
Close et al.

(10) Patent No.: US 12,287,233 B2
(45) Date of Patent: Apr. 29, 2025

(54) FORCE SENSING SCALE WITH TARGET

(71) Applicant: Melexis Technologies SA, Bevaix (CH)

(72) Inventors: Gael Close, Bevaix (CH); Jerome Degois, Paris la Defense (FR); Nicolas Dupre, Bevaix (CH); Theo Le Signor, Bevaix (CH); Tim Vangerven, Tessenderlo (BE)

(73) Assignee: MELEXIS TECHNOLOGIES SA, Bevaix (CH)

( * ) Notice: Subject to any disclaimer, the term of this patent is extended or adjusted under 35 U.S.C. 154(b) by 383 days.

(21) Appl. No.: 17/850,509

(22) Filed: Jun. 27, 2022

(65) Prior Publication Data

US 2022/0412791 A1  Dec. 29, 2022

(30) Foreign Application Priority Data

Jun. 28, 2021 (EP) ...................................... 21182116
Nov. 5, 2021 (EP) ...................................... 21206815

(51) Int. Cl.
*G01G 7/02* (2006.01)
*A47J 42/44* (2006.01)
(Continued)

(52) U.S. Cl.
CPC ................... *G01G 7/02* (2013.01); *G01L 1/04* (2013.01); *G01L 1/122* (2013.01);
(Continued)

(58) Field of Classification Search
CPC . G01G 7/02; G01G 7/00; G01G 19/52; G01L 1/04; G01L 1/122; G01L 1/127;
(Continued)

(56) References Cited

U.S. PATENT DOCUMENTS 5,000,274 A * 3/1991 Bullivant ............. G07G 1/0054
177/128
6,026,694 A    2/2000 Gray
(Continued)

FOREIGN PATENT DOCUMENTS

CN    112067170 A   12/2020
DE    102012101081 A1   8/2013

OTHER PUBLICATIONS

Kawasetsu et al., "Flexible Tri-Axis Tactile Sensor Using Spiral Inductor and Magnetorheological Elastomer," IEEE Sensors Journal, vol. 18, Jul. 15, 2018, pp. 5834-5841.
Search Report from corresponding European Application No. 21182116. 0, Dec. 20, 2021.
Search Report from corresponding European Application No. 21206815. 9, Apr. 21, 2022.

*Primary Examiner* — Jacques M Saint Surin
(74) *Attorney, Agent, or Firm* — Workman Nydegger

(57) ABSTRACT

A weight sensor comprises a sensing system including a target piece and a sensing element, configured to provide changes of a magnetic field, being generated by motion of the target piece. The sensing element senses these changes and provides a signal representative of the position of the target piece. An integrated circuit with processing means can process signals from the sensing element. The flexible piece receives a force stimulus, so that upon exerting a force on the flexible piece by a product due to the weight of said product, the displacement of the target piece with respect to sensing elements can be sensed.

28 Claims, 7 Drawing Sheets

(51) Int. Cl.
  *G01L 1/04* (2006.01)
  *G01L 1/12* (2006.01)
  *G01R 33/00* (2006.01)
  *G01R 33/07* (2006.01)

(52) U.S. Cl.
  CPC ....... *G01R 33/0047* (2013.01); *G01R 33/072* (2013.01); *A47J 42/44* (2013.01)

(58) Field of Classification Search
  CPC . G01L 1/14; G01L 1/564; G01L 1/569; G01L 5/226; G01R 33/0047; G01R 33/072; B25J 13/082; A47J 42/44
  USPC ....................................................... 177/245
  See application file for complete search history.

(56) References Cited

U.S. PATENT DOCUMENTS

| | | | |
|---|---|---|---|
| 7,047,826 B2 * | 5/2006 | Peshkin | G01L 1/14 |
| | | | 73/862.53 |
| 7,536,218 B2 * | 5/2009 | Govari | A61B 5/0538 |
| | | | 600/547 |
| 10,054,503 B2 * | 8/2018 | Ma | A61B 5/6895 |
| 10,401,238 B2 * | 9/2019 | Bonifas | G01L 1/14 |
| 2013/0194028 A1 | 8/2013 | Brandl et al. | |
| 2017/0336273 A1 | 11/2017 | Elangovan et al. | |
| 2019/0226880 A1 * | 7/2019 | Raman | G01D 18/008 |
| 2021/0018574 A1 | 1/2021 | Chen et al. | |
| 2022/0412816 A1 * | 12/2022 | Dupre | G01G 7/00 |
| 2023/0070938 A1 * | 3/2023 | Close | G01D 5/145 |

* cited by examiner

FORCE SENSING SCALE WITH TARGET

FIELD OF THE INVENTION

The invention relates to the field of force sensors as weight sensors. More specifically it relates to a weight sensor using position sensing based on induction or magnetic sensing, a sensor assembly, and a manufacture method.

BACKGROUND OF THE INVENTION

The measurement of small-scale products, for example coffee for individual servings, is traditionally done with volumetric measurement, such as scoops or spoons. Reproducibility and consistency are difficult to achieve. While kitchen scales, based on mechanical deformation, have been used since long, they are not accurate for very small quantities of product.

Existing electronic scales, based on the measurement of the change of resistance when a conductor is pressed, became widespread since the mid-2010. However, these scales are prone to malfunction in case of spillage, as well as being relatively sensitive to temperature changes. This can be an important problem in case of measuring hot products, such as freshly brewed coffee. A compact design is also preferable, so the scale can be fitted next to another device (such as a brewer) or even integrated in a domestic appliance such as a kitchen appliance or a so-called 'white appliance'.

SUMMARY OF THE INVENTION

It is an object of embodiments of the present invention to provide a compact and effective weight sensor for sensing weight forces, especially in a domestic environment, in an accurate way. It is a further object to provide a domestic appliance including such weight sensor.

The present invention provides a weight sensor comprising a sensing system with a target piece and a sensing element. The sensing element is configured to sense changes of the magnetic field from motion of the target piece with respect to the sensing element, the sensing element being configured to provide a signal representative of changes of the target piece position. An integrated circuit comprises processing means for processing signals from the sensing element.

A flexible piece comprises the target piece for providing motion of the target piece upon placement of a product to be weighted over the flexible piece. The flexible piece is arranged for receiving a force stimulus, so that upon exerting a force on the flexible piece, the displacement of the target piece with respect to the surface of the semiconductor package can be sensed by the sensing element.

The product to be weighted may be received on a receiving platform which can be rigidly attached to the flexible piece.

Such weight sensor or scale is highly integrable and it can be made very compact without sacrificing accuracy, as the principle of weight is position sensing based on magnetic field variations (e.g., between a magnetic target or induction-based target).

The top projection of the integrated circuit forms an outline, and the top view of the flexible piece can be smaller than or equal to the outline of the integrated circuit. Thus, the flexible piece can be fit in the outline of the integrated circuit.

Alternatively, or additionally, the integrated circuit can also be packaged in a semiconductor package where its top projection forms an outline. In other words, the projection of the package with the largest area is the outline. In some embodiments of the present invention, the semiconductor package (also known as IC package) includes a mold covering partially or totally the integrated circuit. The flexible piece can be attached to the semiconductor package, where the attachment area between the flexible piece and the semiconductor package is smaller than or equal to the outline of the semiconductor package.

It is an advantage of embodiments of the present invention that a compact force sensor can be obtained with low footprint, with a target embedded in a flexible piece which is directly integrated on a semiconductor package.

In some embodiments of the present invention, the semiconductor package comprises a surface facing away from the integrated circuit and wherein the flexible piece is deposited or adhered to the surface of the semiconductor package. In some embodiments, the flexible piece is an elastomeric sheet.

It is an advantage of embodiments of the present invention that the elastomeric sheet can be easily provided, for example, by molding and attaching to the semiconductor package.

In some embodiments of the present invention the semiconductor package has a planar shape with a lateral projection with lower area than a top projection of the semiconductor package, wherein the flexible piece is attached to that semiconductor package without extending beyond the top projection.

It is an advantage of embodiments of the present invention that the footprint of the force sensor is as large as a semiconductor package.

In some embodiments of the present invention, the target piece has a predetermined shape with a largest dimension in the top projection, and the integrated circuit or the semiconductor package has a largest dimension in the top projection. The ratio between said dimension of the semiconductor package or integrated circuit and said dimension of the target piece is 1.5 or larger.

In some embodiments of the present invention, the sensing element is a Hall effect-based position sensing element, and the target piece is a magnetic target piece.

It is an advantage of embodiments of the present invention that sensing is not affected by the presence of non-ferromagnetic parts.

In some embodiments of the present invention, the sensing element is an inductive sensing element, and the target piece is a conductive target piece.

It is an advantage of embodiments of the present invention that sensing is robust against stray fields.

It is an advantage of embodiments of the present invention wherein the target piece is a metallic sheet embedded in or provided on the flexible piece.

It is an advantage of embodiments of the present invention that a metallic sheet may be easy to provide on or within the flexible piece, for example it may be a metal plate on or embedded in the flexible piece.

In some embodiments of the present invention, the target piece is a rigid target piece with less flexibility than the flexible piece so that the force stimulus on the target piece deforms the flexible piece.

It is an advantage of embodiments of the present invention that the displacement of the target piece can be accurately measured.

In some embodiments of the present invention, the target piece is a metal trace deposited on the flexible piece. It is an advantage of embodiment of the present invention that the sensor has a low profile. In alternative embodiments, the target piece is a metal plate. For example, the metal plate may be embedded in the flexible piece.

In some embodiments of the present invention, the sensing element is provided between the integrated circuit and the target piece.

It is an advantage of embodiments of the present invention that the sensitivity of the sensing element is high by placing the sensing element close to the sensed target.

In some embodiments of the present invention, the sensing element is adjacent to the integrated circuit. It is an advantage of embodiments of the present invention that the sensor has a low profile. It is a further advantage that the IC substrate can be offset over the flexible piece, so the substrate does not receive direct stress from the contact of external objects with the flexible piece.

In some embodiments of the present invention, the sensing element is integrated with the processing means in the integrated circuit (IC).

It is an advantage of embodiments of the present invention that the sensor has very compact and a low profile.

In some embodiments of the present invention, the weight sensor includes a temperature sensor for measuring the temperature of parts of the weight sensor, for example of the target, or the integrated circuit, or of the elastomer.

It is an advantage of embodiments of the present invention that signal drifts of the sensing elements due to changes of temperature can be taken into account and compensated.

In some embodiments of the present invention, more than one sensing element is included. The at least two sensing elements may be spaced apart by a predetermined distance. The processing means may be adapted to process signals from the sensing elements. The difference or the gradient between the measurement by the sensing elements of at least one component of the field can be obtained. Processing means may be adapted to obtain the weight of the product, based on said gradient. The processing means may be included in the integrated circuit, in some embodiments of the present invention.

It is an advantage of measuring differences or gradients that the weight measurement is less sensitive or insensitive to external stray magnetic fields.

In some embodiments, two or more components of the field can be measured. Optionally, the gradient in different components of the field can be obtained. Optionally, the signals may be processed for obtaining the ratios of the components and/or gradients.

It is an advantage of sensing two or more components (2D or 3D sensor) and processing two or more components (e.g., ratios) is that the dependence to magnetization fluctuations of the magnetic source is highly reduced, including target magnetization change due to temperature, or aging of the target, e.g., magnetic target.

In a further aspect, the present invention includes a weight sensor assembly comprising the force sensor of the first aspect of the present invention wherein the integrated circuit (IC) is further adapted to provide readout signals based on the processed signals from the sensing element. The assembly further comprises a support structure, wherein the force sensor is provided on the support structure including connections for rerouting readout signals generated in the force sensor to an external output. The support structure may be a PCB, but in some embodiments the sensor assembly is a PCB-less sensor.

In a further aspect, the present invention includes a domestic appliance comprising the weight sensor of the first aspect of the present invention.

For example, the appliance may be a coffee grinder comprising the weight sensor assembly for measuring the weight coffee beans or of ground coffee. It is an advantage that the resolution of such weight sensor allows resolving single coffee beans.

For example, the appliance may be a brewing device comprising the weight sensor assembly for measuring the weight of a brew, e.g., a coffee brew.

For example, the appliance may be a cooking device comprising the weight sensor assembly for measuring the weight of foodstuffs.

For example, the appliance may be a washing device comprising the weight sensor assembly for measuring the weight of a washing product.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
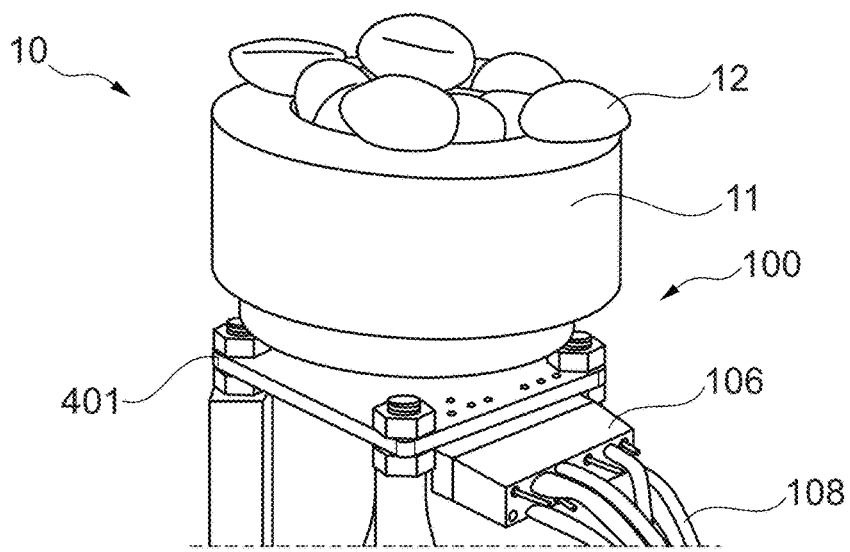
FIG. 1 illustrates a scale assembly in accordance with embodiments of the present invention being used to weight coffee beans.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some, but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "integrated circuit", reference is made to a semiconductor substrate including electronic components forming a circuit for a purpose, for example processing signals and providing readout signals based on the processed signals.

Where in embodiments of the present invention reference is made to "target piece" or "target" for short, reference is made to a shaped piece of material whose position variation is sensed by a sensing element.

Where in embodiments of the present invention reference is made to "flexible piece", reference is made to a shaped piece of material with flexible properties, for example it may be compressible, and it preferably has elastic properties, so it returns to the original shape in the absence of forces. Compression on the flexible piece provides a displacement of the material matrix forming the piece. In some embodiments, the term "elastomer" will be used, but the present invention is not limited to pieces made by elastomeric polymers.

The present invention relates to scales for domestic usage and for business alike, for example for use by baristas and in laundry business. In these activities, it is often required weighting accurately a relatively small quantity of a product, such as foodstuffs, tea or coffee, or washing products such as detergents. In some cases, it is required to track and monitor the change of weight during for example coffee brewing process.

The present invention provides a weight sensor, or simply scale, including at least one force sensor including sensing elements and a target, based on sensing the relative position of the target relative to the sensing elements. These sensors need to be small and able to detect forces within a range sensitive enough for the required application.

The present invention provides force sensing based on proximity sensing using a sensing element which senses changes of position of a movable target. The extent of the target motion depends on the weight of the body placed on the scale. Sensing may be based on an electromagnetic sensing. For example, it may be based on the detection of variations of a magnetic or, in general, electromagnetic field, due to the target motion. The target may generate a magnetic field, for example it may be a magnet, or it may be a conductor in which a magnetic field can be induced. The sensing element may sense changes of the position depending on the nature of the field. The sensing element produces signals which are processed by processing means in a packaged integrated circuit. The target piece and the sensing element may be appropriately chosen and combined, thus forming a 'sensing system' with elements adapted to cooperate with each other to generate or induce an electromagnetic field whose changes are caused by motion of the target and whose detection by the sensing element can be correlated with the amount of displacement of the target. For example, a magnetic sensing element (e.g., a Hall sensor) may be combined with a magnet as a target.

Motion of the target piece due to the weight of a product is provided by an elastic or flexible piece which supports the target piece. Upon contact, the flexible piece deforms in accordance with the weight of the body or product to be measured. The target piece, being part of the flexible piece, also moves. The more mass, the more the flexible piece deforms. This allows keeping track of the mass of the product as it is being added on the scale.

The processing means is configured to accept the signal from the sensing element and process it to provide the weight. For example, the processing may include comparison and correlation with stored values (e.g., in a lookup table) which link the signal measured with displacement of the target, or calculation based on mathematical relationships including e.g., the compression modulus of the flexible piece, calculation of displacement of the target, etc.

Position sensing (sensing the position of a target relative to sensing elements) based on the measurements of changes of fields, such as magnetic fields, is a very accurate technique that can be provided in highly compact devices, for example by using Hall sensing elements or inductors.

The sensing element and the processing means used to process the measurement can be included in a single semiconductor package, even in a single integrated circuit. The flexible piece can be provided on the semiconductor package, for example it can be attached thereto, or directly on the integrated circuit. In some embodiments, the flexible piece is smaller than the package itself, without completely surrounding the package; it may be even smaller than the integrated circuit. This allows providing a compact scale.

By integrating the elastomer and target directly onto the package or integrated circuit and keeping it also within at least the package outline borders, it provides a significant advantage towards compactness and integration with a domestic appliance, a white appliance, kitchen appliances or the like.

In a first aspect, the present invention provides a scale including a force sensor for sensing weight of a product. It includes a sensing system including a sensing element which can sense the position displacement of a suitable target, and the target itself.

The sensing system may include one or more sensing elements for sensing one component of the field, for example Bz, parallel to the direction of the weight (1D sensing). This is a simple layout that allows simple signal treatment. Alternatively, the sensing system may include one or more sensing elements for sensing one component of the field perpendicular to the direction of the weight (e.g., Bx). Applications where signal drift is negligible, and/or temperature compensation is not an important requirement, e.g., applications for weighting detergent, washing liquid or washing powder for laundry machines, dishwashers or the like, may comprise sensing elements for 1D sensing. However, compensation of signal drift due to temperature changes can be anyway provided by adding a temperature sensor, for compensating signal drift due to temperature changes in the sensing system.

The sensing system may include sensing elements for sensing two or more components of the field (2D or 3D sensing). Using two or more components allows reducing field fluctuations (such as magnetic fluctuations due to temperature changes or aging of magnet) simply by signal processing, with no need of additional temperature sensing. However, the present invention is not limited thereto, and a scale including a 2D or 3D sensing system may also include an additional temperature sensor.

The scale of the present invention can also include a processing means (e.g., a processor) usually on an integrated circuit IC. This can be provided in a semiconductor package, also called integrated circuit package, or IC package for short. In some embodiments of the present invention the IC package also includes the sensing element, not only the IC with the processing means. The processing means receives measurement signals from the position sensing element. These signals indicate displacement of the target piece included in a flexible piece deposited on or attached to the IC package.

In some embodiments, the target piece may comprise of magnetic material, and/or electrically conductive material, depending on the type of sensing element. For example, it may be a magnet for a Hall sensing element. For example, it may be a metal sheet, plate or trace, for an induction-based sensing element.

In some embodiments, the flexible piece does not surround completely the IC package. For example, it may only partially overlap the IC package. The IC package layout, or overlay, or top view, contains completely the attachment area of the flexible piece. For example, the flexible piece may not extend beyond the outline of the IC package. The footprint of the force sensor is the area which the sensor occupies on a larger system, for example a PCB. The scale of some embodiment of the present invention may have a footprint as large as the IC or the package, instead of being a large piece of rubber or other elastomer overlapping the processor and the sensing element.

In some embodiments, the scale includes a receiving platform, such as a tray or the like, which may be rigidly coupled to the flexible piece. The receiving platform preferably has a stiffness such that a deformation in compression of the platform due to the presence of a product is negligible, compared to the deformation of the flexible piece.

FIG. 1 shows a scale assembly including a scale 10 and a scale assembly including a support 401 for the scale in a simple technical embodiment, including a force sensor 100 and a receiving platform 11 to collect the product 12 to be weighted. The product is coffee beans in this case. The force sensor 100 includes magnetic sensing elements, processing means on integrated circuitry (covered by the receiving platform 11), a support 401 being a printed circuit board (PCB) 401, and a flexible piece (also covered by the receiving platform 11) embedding the magnetic target. In this particular case, a 2×2 array of magnetic sensing elements allow sensing magnetic field gradients of the magnetic field component perpendicular to the direction of the weight, as it will be discussed further with reference to the rest of the figures, in particular FIG. 5. The integrated circuitry can be protected by a semiconductor package provided on the support 401 (hidden by the receiving platform). The weight sensor assembly in FIG. 1, or scale assembly, further includes connections 106 to output the signal from the sensing elements, for example via signal transmitting cables 108.

Figure 2:
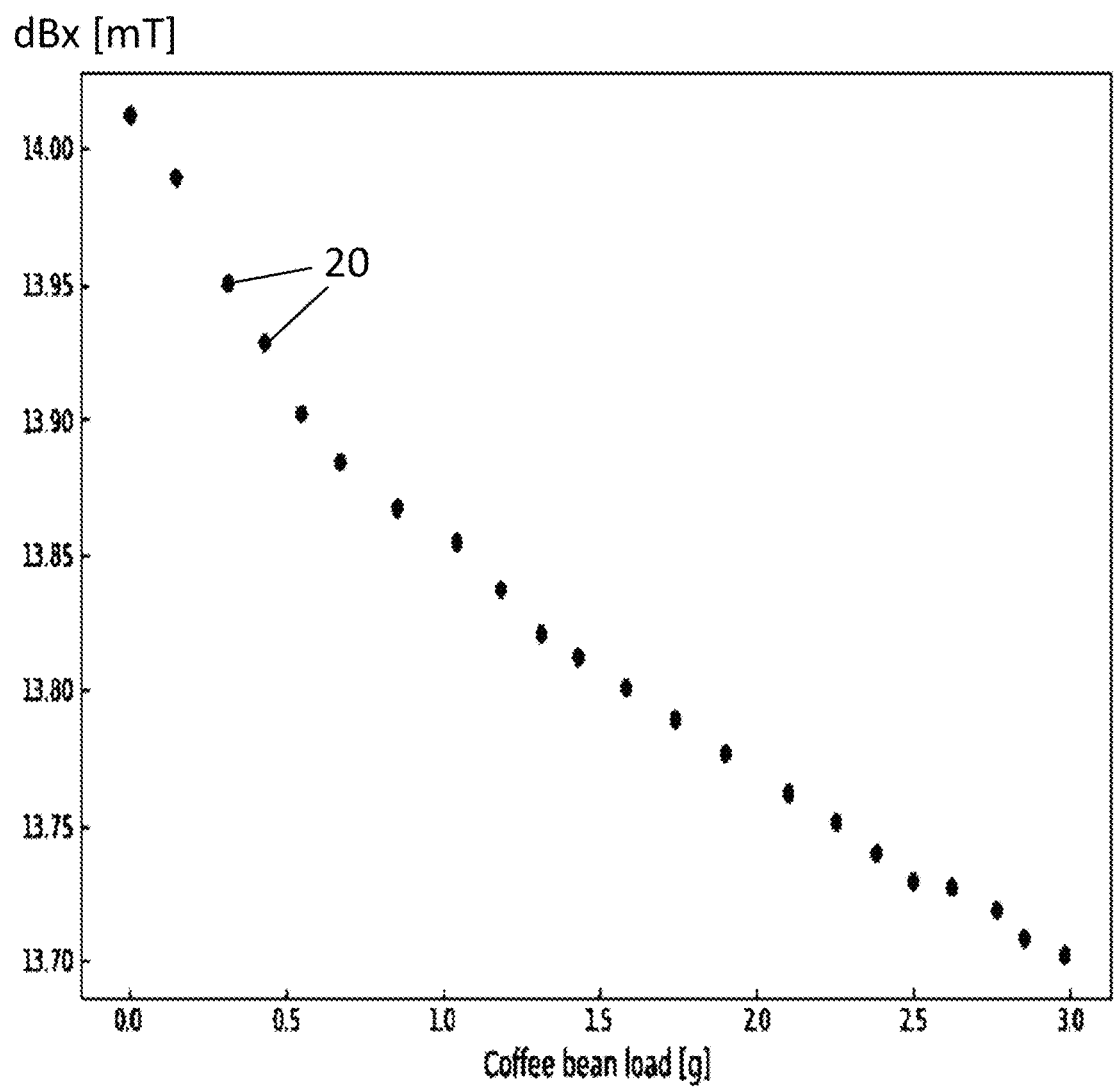
FIG. 2 illustrates a cumulative magnetic signal response as a function of the coffee bean mass obtained from FIG. 1. Each point represents the addition of one coffee bean

The following trial was carried out. First, individual coffee beans were first measured on a reference scale. Then, they were transferred one by one onto the platform, and the raw magnetic change was recorded. The graph of FIG. 2 shows the cumulative magnetic signal response as a function of the coffee bean mass. Each point 20 represents the addition of one coffee bean. This experiment illustrates the ability of the sensor to resolve individual coffee bean, which has an average weight of approximately 0.15 g. The resolution and the full range of the scale can be adjusted by design parameters (e.g., by changing the softness of the flexible piece 104, e.g., by changing the elastomer, and scaling the contact area e.g., the receiving platform). This could be useful to optimize the range of the sensor, and optimize measurement and resolution to even smaller weight range.

Figure 3:
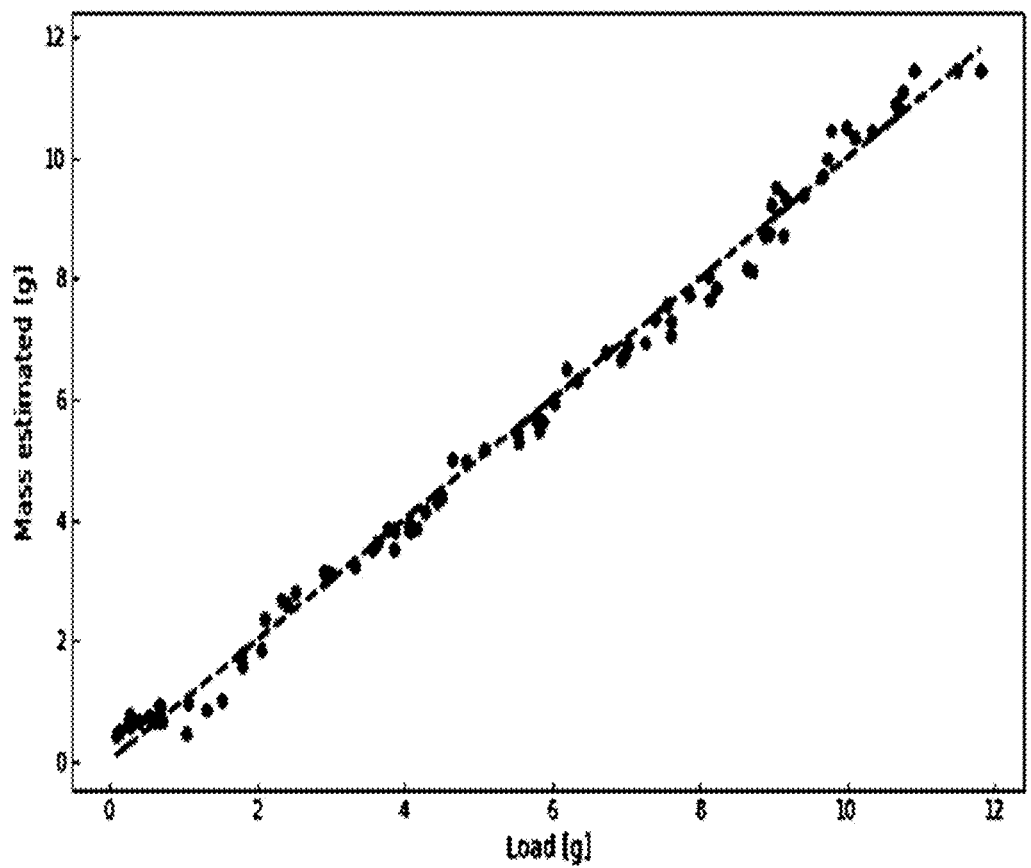
FIG. 3 illustrates the calibrated output for the scale shown in FIG. 1

A simple regression model with the magnetic feature allowed us to correctly calibrate the sensor as a scale, outputting weight in grams. The calibrated output obtained using the scale of FIG. 1 is shown in FIG. 3.

In the following FIG. 4 to FIG. 9, different force sensors for devices in accordance with embodiments of the present invention are shown.

Figure 4:
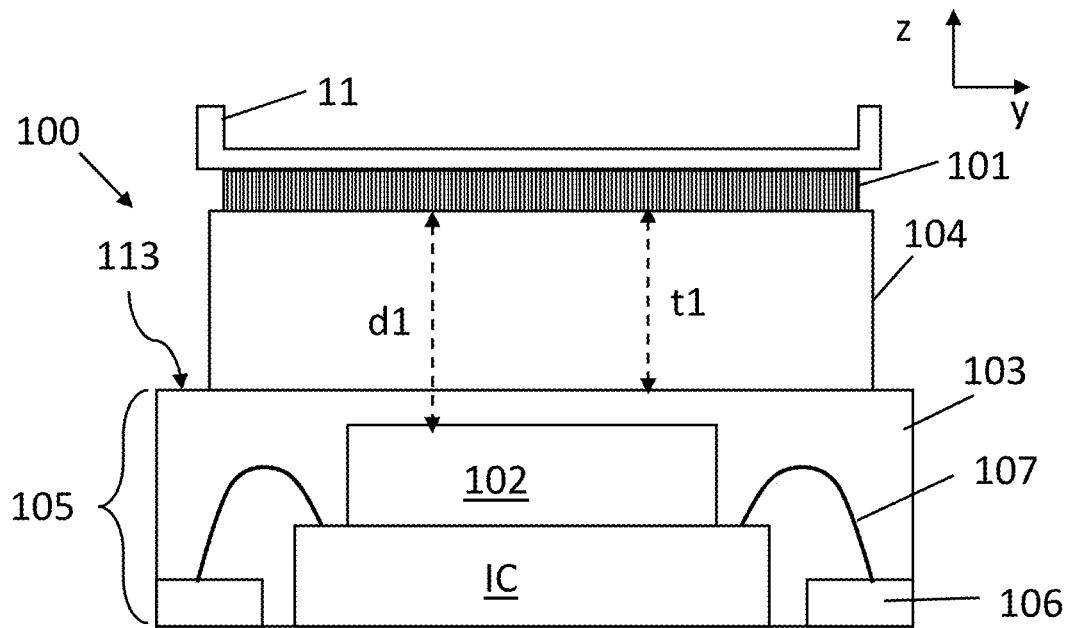
FIG. 4 illustrates a cross section of a scale, including a force sensor, in accordance with embodiments of the present invention, showing chip connections.

FIG. 4 shows an exemplary embodiment of a scale including a force sensor 100 including a Hall sensing element 102 placed on and connected to the integrated circuit IC for detecting the position of the magnetic target 101 embedded in or disposed on a flexible piece 104. The sensing element 102 may be a different type of proximity detector (such an induction-based sensing element), as long as it can detect at least the variation of position of a target. The product to be weighted is received by the scale including the force sensor (e.g., on a receiving platform 11, such as a tray), so the target is displaced by the weight of the product. Preferably it is received so the elastomer compresses under the weight of the product, and the target displaces in the direction between the target and the Hall sensing element. The present invention is not limited to this, and in other embodiments the target may displace sideways with respect to the sensing elements, the relative displacement being measured and linked to the amount of product being placed on the scale.

The receiving platform 11 can be rigidly coupled to the flexible piece 104. This can be applied in general to any scale of the present invention, not only to the embodiment of FIG. 4. The receiving platform 11 may be larger than the flexible piece 104, for example two times larger or more, for example 4 times larger or more, for example 10 times larger or more, than the flexible piece 104. The weight of the receiving platform 11 may be taken into account as well as the stiffness of the flexible piece for calculating the weight of the product based on the compression of the flexible piece 104.

The force sensor 100 may comprise a package 105 including the integrated circuit IC and the sensing element 102 which are covered or encapsulated by a mold 103, such as resin or the like, or any other known materials. FIG. 4 shows the sensing element 102 in contact with the integrated circuit IC, the sensing element being an element surrounded by the package 105, for example embedded in the same mold as the circuit IC, except where it is in contact with the circuit IC. The relative position of the sensing element with the circuit is explained below. The sensing element 102 may be monolithically integrated in the IC.

In some embodiments, the integrated circuit package 105 may be a 'small outline integrated circuit' (SOIC), a 'quad flat no leads' (QFN) package, etc. In any case, the package 105 has usually a flat profile, with a relatively large surface area on the top projection, compared with the small, narrow area of the lateral projection of the package 105. FIG. 4 shows the lateral view of the sensor. The area of the surface corresponding to the top projection will be named top surface 113 for short. It is an external surface, facing away from the internal circuit IC. Typically, it is a planar, flat surface, but it may have other profiles.

The flexible piece 104 may be a compressible sheet or plate, for example an elastomer. The position of the target piece 101 can be optimized depending on design, applications, etc.; in the case of FIG. 4, at least one surface may be uncovered. For example, it may be adhered on the top surface of the elastomer facing away from the top surface 113 of the package, forming a layered stack. Alternatively, the target piece may be partially or completely embedded within the flexible piece, as shown in the FIG. 6 and FIG. 7 described below.

In the embodiment of FIG. 4, the target piece 101 may be a magnet, for example, a two pole magnet having an axial magnetization, perpendicular to the top surface of the integrated circuit IC (the surface of the IC facing the elastomer). However, the present invention is not limited to this, and magnets with other magnetization (different orientation, different multipolarity) can also be considered.

In some embodiments the target piece may be a plate such as a planar plate or sheet. In some embodiments it may be stiffer than the flexible piece. The target piece may be a very thin sheet of material, e.g. a metal trace deposited on the elastomer, or embedded therein, etc. The target can also be formed with a suspension of discrete metallic parts in the elastomer (e.g., metallic or magnetic beads and/or powder). The sensing element is sensitive to changes of position of the target piece, which is in turn configured to be detected by the sensing element 102.

Figure 7:
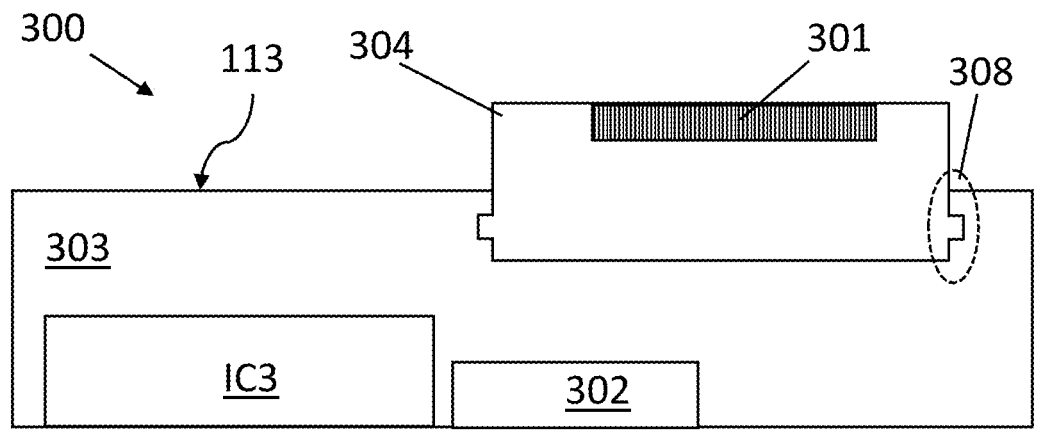
FIG. 7 illustrates a cross section of a force sensor for use in a scale in accordance with embodiments of the present invention, where the sensing element is laid out adjacent to the integrated circuit containing the processing means.
Figure 8:
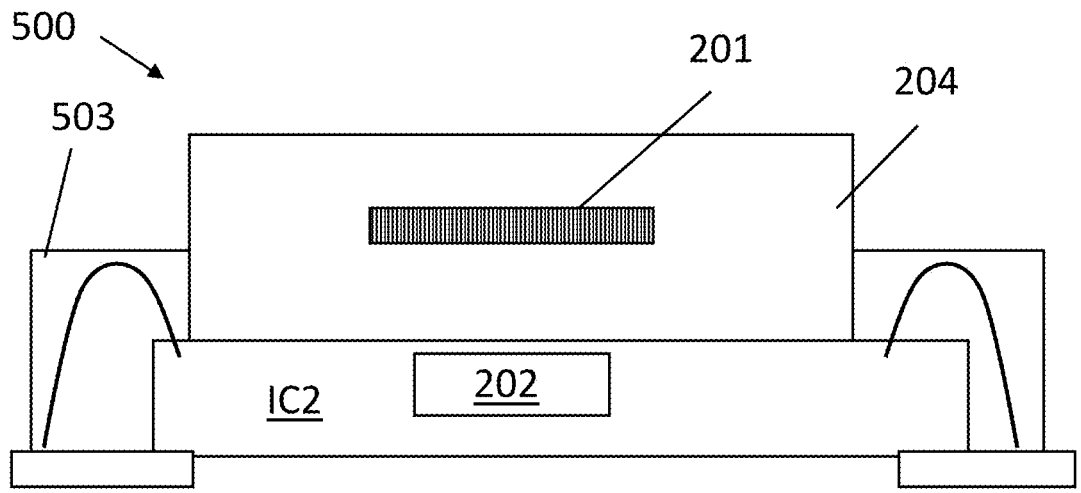
FIG. 8 illustrates a cross section of a force sensor for use in a scale in accordance with embodiments of the present invention, where the elastomer is surrounded by mold of the integrated circuit package and in contact or adhered to the substrate of the integrated circuit.

The flexible piece 104 is provided on the external surface of the semiconductor package 105, for example directly on the top surface 113 of the encapsulant or mold 103. The 'top' refers to the part of the package facing the product to be received, or the part including the receiving means for receiving product to be weighted (e.g., the tray 11 or pot) so the flexible piece 104 is arranged for receiving a force stimulus. In particular, the elastomer is on the IC package, not on a different support such as a PCB or a spacer or the like. The elastomer can be directly adhered to the IC or to the IC package, in particular to the mold of the package as shown in FIG. 4. The flexible piece may not completely overlap the package. This reduces the footprint of the force sensor, improving its compactness and integrability in other devices. In the embodiment of FIG. 4 the flexible piece is attached to an area of the mold smaller than the top surface 113 of the mold, although in other embodiments the attachment area may be equal to the top surface 113 of the mold. In some embodiments, at least part of the flexible piece may be partially embedded by the IC package, for example in its mold. An exemplary embodiment is shown in FIG. 7, although said configuration may be present in any other embodiment of the present invention. In some embodiment of the present invention, the elastomer is in contact with the IC as shown in FIG. 8 below. In some embodiments, the semiconductor package 105 is optional, so the flexible piece is provided on the IC, without extending beyond the outline of the IC. The IC may be directly connected to a support such as a PCB, for example. However, this is not the only example, and the elastomer may extend beyond the IC or beyond the semiconductor package, if present. Additionally, the force sensor may be inverted with respect to the scale, so the product is not received by the receiving platform 11 on the flexible piece as shown in FIG. 4; in other embodiments, the force sensor 100 is upside-down, so the flexible piece is the base of the scale, and the product to be weighted is received e.g. on a tray directly on the part closer to the electronics (e.g. on the board connected to the semiconductor package).

In general, the sensing element is configured to measure the relative displacement of the position of a target piece with respect to the IC package containing the sensing element. This displacement depends on force (weight) applied on the flexible piece including the target piece, from which a signal is obtained and processed by the processing means of the IC circuit. In particular embodiments, the sensing element is a sensing element for sensing EM fields, in particular changes of EM fields due to said motion: in case of compression, the larger the compression, the more the target will approach the sensing element, which is detected by the sensing element, and larger weight will be detected.

The sensing element can measure a position in general, for example a linear position, or even an angular position depending on the design of the scale. In some embodiments, the sensing element may measure a magnetic strength, depending on the magnetic flux and changes thereof, which may be related to the position (e.g., proximity) of the target piece to the sensing element (which in turn can be linked to the compression force). The sensing element may be a Hall effect-based position sensing element, and the target piece may be a magnet whose magnetic field can be sensed by the position sensing element. When a force is applied on the flexible piece, the target piece changes its position accordingly relative to the Hall sensors, which provide a measurement signal dependent of the motion of the target. In some embodiments, the sensing element is an inductive sensing element with coils through which a known current flows, which generates a magnetic field through a conductive target. Changes in the target position induce a current on the target, which affects the magnetic field. This effect is detected as changes of current flowing through the inductive coils, so the sensing element can sense changes of the position of the target piece relative to the sensing element. Accordingly, the target may be a metal plate, metal trace or the like, as long as it provides sufficient conductance to provide signal (e.g., via high enough eddy currents).

The change of magnetic field strength (indicative of position) due to compression, on the Z direction, is only one possibility. In embodiments of the present invention, the sensor can measure alternatively or additionally shear stress (displacement in at least the X directions which is perpendicular to the direction of the compression force) by suitable configuration of the sensing element or elements.

Figure 5:
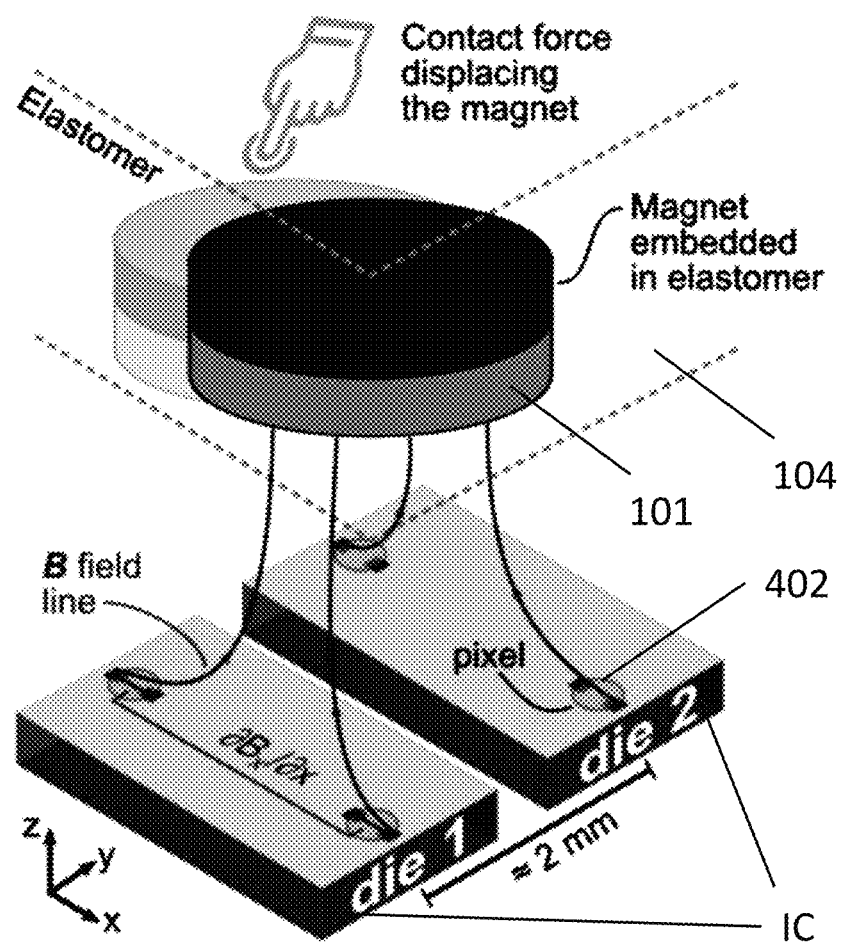
FIG. 5 illustrates a scale including two pairs of sensing elements for sensing a magnetic field component, each element of the pair being separated by a predetermined distance for determining a difference or gradient of said magnetic field component.

FIG. 5 shows a layout where two pairs of sensing elements 402 are arranged to sense the X component of the magnetic field, perpendicular to the displacement of the target 101 by the weight (in the −Z direction). The two sensing elements per pair may sense the difference or gradient in the X direction of the field due to the weight of the product.

This solution is very robust against magnetic stray fields. The force readout is hardly disturbed by a magnetic stray field up to 1 mT or even 5 mT (error <1% of full scale), without sacrificing compactness. The embodiment of the figure can be about 5 or 6 mm in diameter, and 5 mm in height (package height and height of the flexible piece included). This illustrates the advantageous compactness of magnetic-based sensor for force sensing, which can provide highly compact and integrable scales.

FIG. 5 also shows two ICs comprising sensing elements for sensing a magnetic component in two different positions. The signals of each IC can be further be processed by a further processor or the like. The sensing elements 402 may be separated by 2 mm between the IC dies and by 2 mm between sensing elements 402 in the same die.

The sensor may sense one component of the field (for example Bz, out of plane field), but the sensor could also be a 2D or 3D sensor and sense 2 or more components of the field. For example, the sensor may comprise 2 or more sensing regions, each region sensitive to one or more field components, e.g., two in-plane sensors for sensing the X component Bx spaced apart as shown in FIG. 5.

In one embodiment the sensor comprises 4 sensing areas, each of them being sensitive to 3 fields components (for example 4× 3D sensors)

The weight may be determined based on the direct measurement of a field component, which is simple to process, e.g., using a relationship or lookup table. However, more accuracy can be provided when the weight is determined based on a ratio between two field components, or for example based on a norm of two or more components or based on an angle between two or more field components.

An advantage of sensing two or more components (2D or 3D sensor) and processing two or more components (e.g., ratios) is that the dependence to magnetization fluctuations of the magnetic source is highly reduced (e.g., magnetization change due to temperature, or aging of the magnet). Of course, in case a single field component, or single gradient is used, the value can be compensated using a temperature sensor, such as to account for magnetic field drifts due to temperature (Hall plate sensitivity and-or magnetic source magnetization drift).

In some embodiments as shown in FIG. 5, the weight may be determined based on at least a magnetic field difference, or gradient (e.g., dBx as shown in FIG. 2), or based on a ratio of magnetic field gradients, or the norm thereof, or even on the angle thereof. For example, a combination of at least two gradients of components in different directions can be used.

An advantage of measuring differences or gradients is that the weight measurement is less sensitive or almost insensitive to external stray magnetic fields.

An advantage of determining the weight based on a combination of at least two gradients (e.g., using a ratio, or a non-linear regression, or a neural network) is that the measurement is less sensitive or almost insensitive to both external stray field and temperature drifts of the field source (e.g., of the magnetic target).

The weight may be determined as a linearized output of any of the above or combination of the above, using for example a linear or non-linear regression, or a machine learning model. For example, a machine learning model uses as input two or more gradients to extract a weight.

Figure 6:
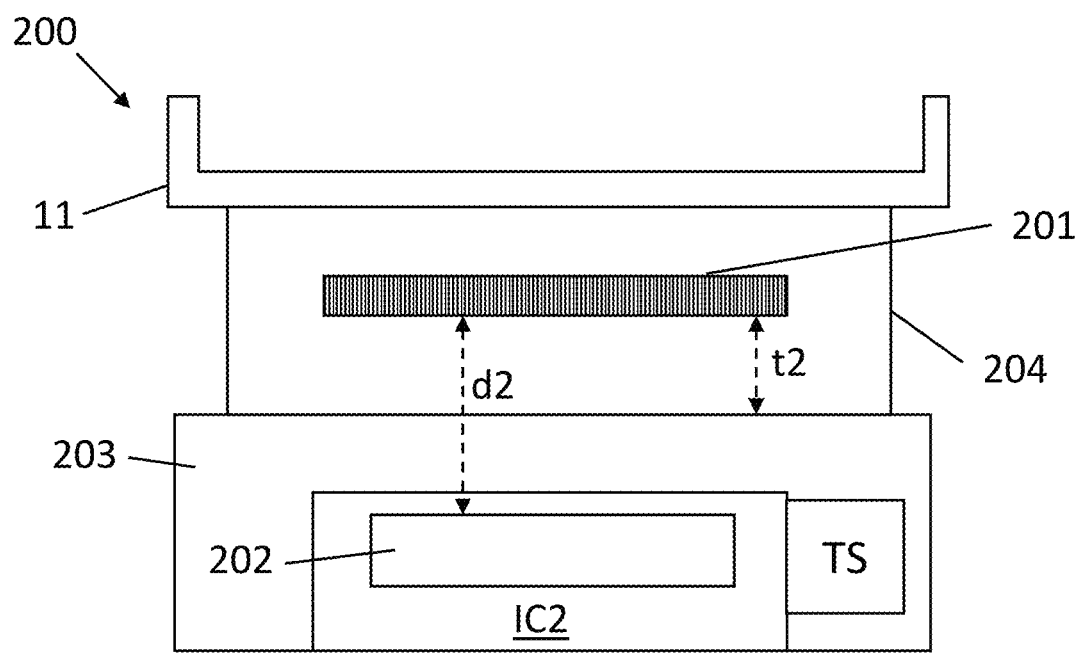
FIG. 6 illustrates a cross section of a scale, including a force sensor, in accordance with embodiments of the present invention, where the sensing element and the processing means are integrated in a single semiconductor substrate forming one integrated circuit.

Optionally, weight fluctuations due to temperature drift of the scale components (i.e., expansion or dilation of the elastomer) may additionally be compensated using a temperature sensor TS, as shown in e.g., FIG. 6. The temperature sensor may be embedded in the chip, or somewhere in the scale, for example arranged to measure the temperature of the elastomer 204. The compensation can be applied to the field measurements, or to any quantify derived from the field measurements (e.g., norm, or angle, or ratio). The compensation can be applied to the determined weight as well as a final correction step The integrated circuit IC includes at least the integrated processing means, such as a processor, which can be provided on a semiconductor substrate (e.g., silicon substrate, the present invention not being limited thereto). The processing means is configured or programmed for processing signals from the sensing element 102, 402. The processing means and the sensing element are suitably connected, so the processing means can receive said signals. The processing means may be configured or programmed to process the positioning displacement information into signals representative of the contact force, and provide such signals as readout signals indicative of the force exerted on the target piece causing its displacement. At least the displacement of the target, the elastic parameters of the flexible piece and other parameters, such as e.g. acceleration, may be used for calibration of the force sensor. The readout signals may be output, for example to a conductor, e.g., a frame 106, via wiring. The readout signals can be obtained through connections via contacts, pins, etc. to an external circuit such as a PCB, the present invention not being limited thereto.

The sensing element and the IC are both encapsulated in the same package. In the embodiment of FIG. 4, the sensing element 102 is connected to the IC and placed on top thereof, so the sensing element 102 is placed between the flexible piece 104 and the IC, separated from the flexible piece 104 by mold 103 of the package.

The target piece 101 is spaced from the sensing element 102 by a first distance d1 encompassing the distance (d1-t1) between the sensing element 102 (or the part receiving the sensed field) and the flexible piece 104, plus the thickness t1 of the flexible piece which ensures that enough flexible material is provided, so a measurable displacement takes place for a predetermined range of contact forces on the flexible piece. Distance d1 between the target piece and the sensing element can be optimized by selecting the appropriate flexible piece and the thickness t1 thereof, so that there can be enough displacement on the target piece to be sensed by the sensing element, but avoiding the thickness to be so large that the field from the target (e.g., magnetic field) is weakened at the position of the sensing element 102. Calibration data can also be provided and stored in, for example, a memory, e.g., an integrated memory.

In other embodiments, as shown in FIG. 6, the sensing element 202 and processing means can be integrated in the same integrated circuit IC2. This configuration can be applied to any other embodiment, not being limited to the embodiment of FIG. 6.

FIG. 6 shows a force sensor 200 including a compact elastomer 204, for example an elastomeric sheet, completely embedding the target piece 201. As before, the thickness t2 of the flexible piece can be tailored, so as to provide enough cushion to improve sensitivity of the sensing element while at the same time keeping the distance d2 between the target piece 201 and the sensing element 202 not so large that it hinders significantly the signal detection characteristics (such as e.g., signal to noise ratio). The target piece 201 may be covered by a shielding layer or it may be embedded within the elastomer 204, specially shielding the target piece 201 from physical contact with external pieces or from potentially corrosive or oxidating environment, products or water spillage. Embedding the target piece 201 in the flexible piece may improve compactness. A temperature sensor TS can provide sensing of temperature of the IC2, the environment, the target piece 201 and/or the elastomer 204, and the signal of the temperature sensor may be used to correct temperature drifts.

FIG. 6 also shows that the integrated circuit IC may also integrate the sensing element 102. Thus, the package can be very compact, as the mold 203 still encapsulates both the sensing element and the processing means, but both in a single integrated circuit, e.g., in a single semiconductor die. This embodiment is very compact and has low profile and footprint, due to the combination of the sensing element-processing means integration and the target-elastomer integration. However, the elastomer integrating the target may be applied to any other embodiment, as well as the integrated circuit IC integrating the sensing element can be applied to any other embodiment. The sensing element or parts thereof may be integrated in the same semiconductor substrate as the processing means, forming an integrated circuit with both. In other embodiments, only some parts of the sensing element may be integrated in the semiconductor die.

In alternative embodiments, as shown in FIG. 7, the sensing element 302 can be placed adjacent to the integrated circuit IC3 with the processing means. The signals may be transmitted from the sensing element 302 to the processing means by wirebonds, for example. The integrated circuit and the sensing element 302 do not even need to be in physical contact, both of them are however encapsulated in the same mold 303. In general, the sensing element may be overlapped by the target. The target piece may be centered with the sensing element or, in the case of the embodiment of FIG. 7, the sensing element (and the integrated circuit IC3) may be laid out offset from the center of the target and for example also from the whole flexible piece. The force sensor has larger footprint, but potentially lower profile (less height) than other embodiments such as e.g., the embodiment of FIG. 4, in a simple layout of easy manufacture. This configuration also reduces risks to damage the circuit with the processing means, because most or all pressure from the weight of the product is not transmitted through the flexible piece 304 and mold 303 directly on the integrated circuit IC3, thus protecting the processing means in the integrated circuit IC3.

FIG. 7 also shows a flexible piece 304 partially embedded in the mold 303. This feature may be applied to other embodiments, not necessarily to the one of FIG. 7 only. The mold 303 may be shaped to fit the flexible piece 304, thus reducing the risk of tearing the flexible piece away from the package due to shear forces perpendicular to the compressing forces. For example, the mold and the elastomer may be shaped so they interlock, e.g., including interlocking elements 308 such as ribs and slits. Less or no adhesive need to be provided to attach the flexible piece to the mold, thus advantageously saving costs. For example, the flexible piece may be flush with the mold surface, so no adhesive is absolutely required. As before, the surface of the flexible piece keeping it fixed in place is smaller than the area of the package where the flexible piece is provided (e.g., it does not extend beyond the package). For example, the top projection of the flexible piece may not extend beyond the top projection of the package, thus allowing a compact force sensor with small footprint. The top projection may also be understood as the direction following the applied weight to be measured.

A receiving platform (not shown) may be rigidly attached to the flexible piece 304.

In some embodiments, the top projection of the target is also contained with the area of the IC package. In other words, the target may be smaller than the IC package, e.g., smaller area and/or smaller volume, e.g., smaller than the IC. Although a small target (e.g., small magnet) is only able to provide a weak field to be detected by the sensing element, due to the compactness of the device the target may be positioned closer to the sensing element, compensating for the small size. In some embodiments, the size ratio between the IC and the target piece or between the semiconductor package and the target piece is 1.5 or more, for example between 1.5 and 3, or even larger than 3.

The target piece 301 may be partially embedded in the flexible piece 304, for example it may be flush with the flexible piece. The force sensor may be configured to provide dual sensing, allowing detecting shear forces, for example shear forces in one direction or two orthogonal directions in the plane perpendicular to the direction of the compressing forces. The weight can be measured for different displacements of the target relative to the sensing elements.

Signals generated by the sensing element in the integrated circuit can be processed into readout signals, which can be output by connections from the integrated circuit to the exterior (e.g., through wires, a frame 106, pins, etc., not pictured in FIG. 6 or FIG. 7). The exterior may include a support structure holding the force sensor and conductors for sending the readout signals from the processing unit in the integrated circuit to an external device, a memory, scale display, etc.

In some embodiments, the support structure is a PCB. This is shown in the scale assemblies of FIG. 1 and FIG. 9.

The present invention is not limited to attachment of the flexible piece to the top surface of the mold of the package. For example, the mold of the package may comprise an opening or cavity exposing the interior, e.g., the semiconductor material of the IC substrate, or even the sensing element. The IC substrate can receive the flexible piece as shown in FIG. 8. Thus, the flexible piece may be attached to the semiconductor package, being held in place by the mold, optionally further being attached to the integrated circuit, e.g., to the substrate of the IC. In other embodiments, the flexible piece may be in physical contact or adhered to the sensing element. Thus, the mold may only partially cover the IC substrate, leaving space to receive the flexible piece.

In preferred embodiments, the target piece is completely supported or embedded by the flexible piece. For example, the target piece is smaller than the flexible piece, for example the target piece may be completely contained in the top view or outline of the flexible piece.

Figure 10:
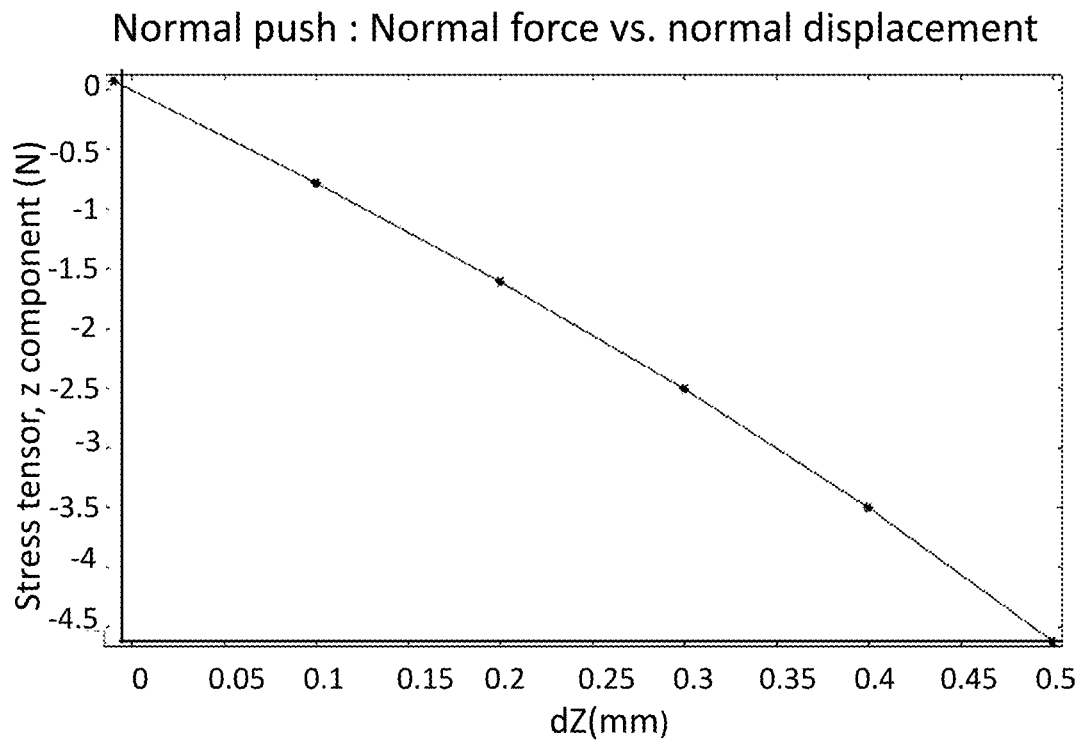
FIG. 10 and FIG. 11 show the simulations of force response to normal displacement (compression) for a particular force sensor and the response of the three spatial components of the magnetic field to the displacement.
Figure 11:
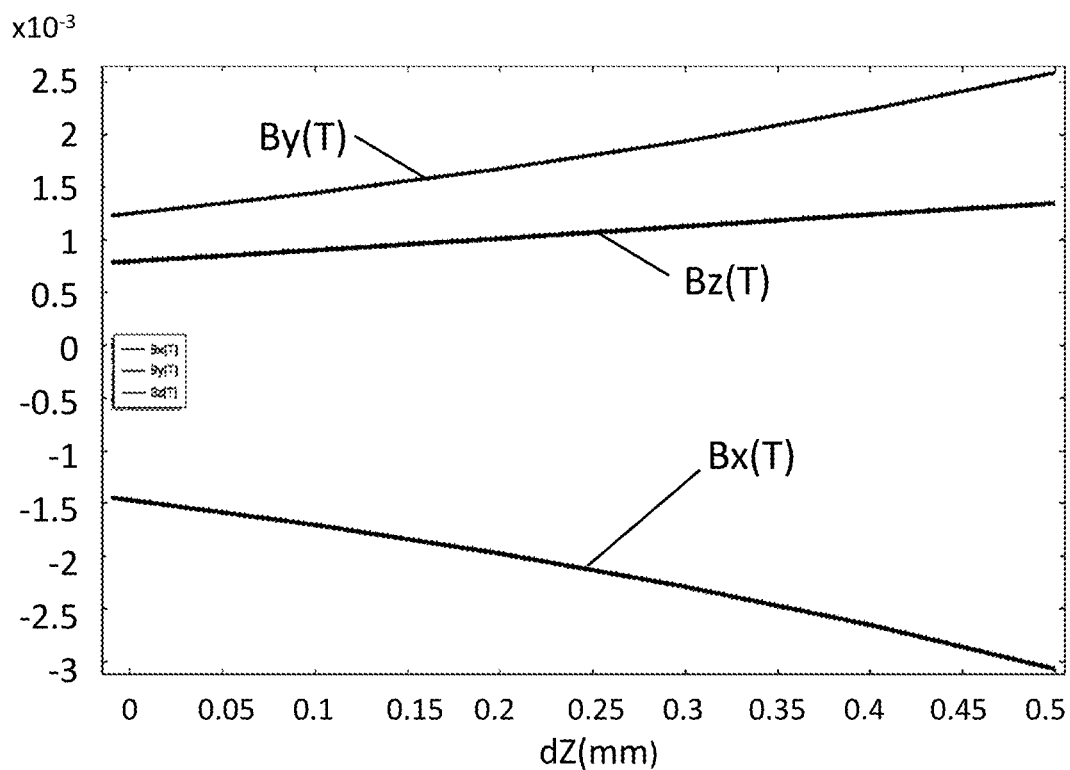

The fact that the target is smaller than the package, so the target is contained in the outline of the IC package, improves the compactness (and, if needed, allows to detect shear stress easily). It is advantageous that the magnet is smaller than a ratio of the outline. For example the side of the flexible piece (e.g. the largest side, e.g. the diameter if the top view is a circumference) and the largest dimension of the target piece may have a ratio of 1.5, or 2, or 3. The exemplary force sensor on which simulations were made as shown in FIG. 10 to FIG. 11 had a target with a diametral dimension of 1.5 mm and a side of the outline of 5 mm (ratio 3).

Despite the small size of the target, and thus the smaller field available for sensing, it has been found that the field can still be measured at the sensor location with the configuration of the present invention.

The detection is not limited to magnetic detection systems. For example, the skilled person can suitably adapt other systems for detection. In a particular exemplary embodiment with induction sensing, two induction coils per axis may be located around the neutral position of the target. At the neutral position, the signals are balanced. When the inductive target moves, the signal (or a ratio of signals) will be unbalanced, and a displacement can be detected. When the target moves up or down, the intensity changes. Thus, any component of the magnetic or induction field or combination of said components can be used to calculate the weight of the product, taking into account the stiffness of the flexible piece.

In some embodiments, the sensor can measure compression (displacement in Z direction, see FIG. 4 or FIG. 8). In some embodiments, it can measure displacement in the three directions if needed. Even torsion can be measured, by adapting the scale to a torsional setup.

Measuring displacement in two or more directions can be implemented, for example, with a 3D sensor, for example a 3D Hall sensor made of a combination of horizontal Hall elements (sensitive to motions with direction perpendicular to the IC) and vertical Hall elements (sensitive to motions with direction parallel to the IC). In some embodiments, the implementation can provide a scale including horizontal Hall elements and magnetic concentrators disposed so as to concentrate components of the magnetic field in different directions separately. In some embodiments, magneto-resistive elements, such as AMR, or GMR, or TMR can be used.

Any component or combination of components (Bx, By, Bz) can be used to detect the displacement in the direction of the weight, usually the vertical Z direction.

FIG. 10 to FIG. 11 show stress tensor variation and simulations of compression of a scale including a force sensor which may be, for example, a 6×6 mm QFN IC package with one magnetic probe (although the present invention may include more probes) on a support and may receive on the top surface a piece of elastomer with a height of 2.5 mm and a top area of 5×5 mm, where the IC package completely surrounds the elastomer. The target piece may be a magnetic disk of 1.5 mm diameter and 0.5 mm thickness, flush with the surface of the elastomer opposite to the surface attached to the IC package, and in the center of the top projection of the elastomer. The probe itself may be offset with the axis of the magnet, for example it may be at a distance in the order of 1 mm from the axis. In embodiments of the present invention, the sensing element or sensing elements may be offset with the axis crossing the center of the target piece up to 2 mm or less. For two probes, the target may be at the same distance of both while not under a contact force.

In some embodiments, the sensor may include one or more sensing element, which may be centered or not with respect to the target piece. In those embodiments where it is not centered, the sensing element or elements may not overlap with the target piece in the top projection. In the exemplary simulations, one probe is located outside the outer periphery of the top projection of the target piece (magnet). For multiple probes, in some embodiments they may be laid out symmetrically around the axis of the target piece (e.g., on the vertices of a square, if there are four sensing elements, where the axis of the target piece passes through the center of the square).

FIG. 10 shows the normal force (in Newtons) as function of the compression displacement (in mm) for the exemplary force sensor described above. The simulation of the magnetic field variation with the position, using one probe, is shown in FIG. 11, for the three dimensions (X, Y, Z).

In a further aspect, the present invention provides a weight sensor assembly including the weight sensor of the first aspect, and further including a support structure for the force sensor. For example, the support structure may provide transfer of signals from the force sensor to an output or data storage or the like. Such output may be a user interface such as a screen. The output or data storage may also be part of the assembly. For example, the support may be printed circuit board (PCB), the present invention not being limited thereto.

Figure 9:
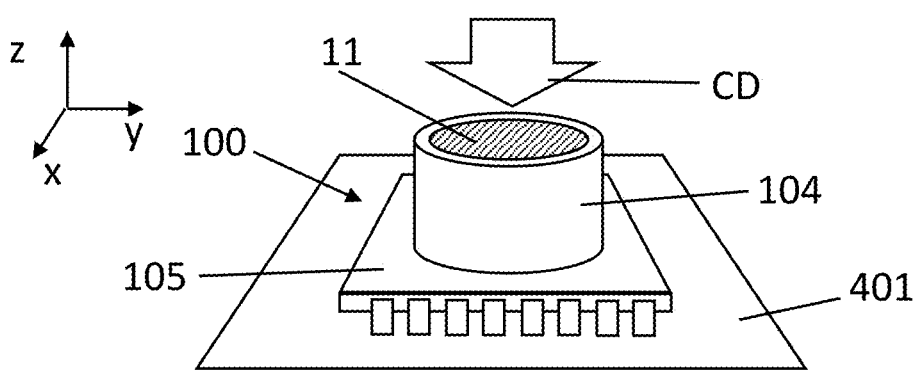
FIG. 9 illustrates a perspective view of a scale in accordance with embodiments of the present invention on a support substrate, forming a scale assembly or weight sensor assembly.

FIG. 9 shows a perspective view of an exemplary embodiment of the scale assembly of the present invention. The force sensor 100 is provided on the support structure 401, and the top surface of the IC package 105 completely surrounds the flexible piece 104 of the force sensor 100, so the flexible piece 104 does not extend over the support structure 401, as it is limited by the top surface 113 of the mold 103 of the package (as shown in FIG. 4). The present invention is not limited to this, and the flexible piece may extend beyond the package 105 over the support structure 401. The support structure 401 may comprise connections and conductive paths such as conductive tracks, for rerouting signals provided by the force sensor 100 to a device for storing and/or displaying data.

For example, the integrated circuit IC may receive signals from the sensing element 102, representative of the motion of the target 101 (see FIG. 4) caused by a weight of a product placed on the elastomer 104, e.g., on a tray or any other receiving platform 11, following the compression direction CD. The integrated circuit IC can be configured to process these signals and provide readout signals, which are rerouted to a display, data storage or the like through conductive tracks in the PCB being the support structure 401. The force sensor may be connected to conductive paths in the support structure via contacts through the package of the sensor to the integrated circuit.

The scale assembly is not limited by a PCB being the support structure, and the assembly may be a PCB-less assembly. In this case, the chip package may be contacted (e.g., soldered) to electrical leads and clipped or glued or 'heat-stacked' to a plastic assembly. These possibilities are further explained with reference to FIG. 32 to FIG. 43 of document US20210018574A1 and the paragraphs describing said figures (e.g. [0297] to [0324]).

In a further aspect, the scale of the present invention may be integral part of a device which operates using a product that can be advantageously weighted. For example, the scale may be integral part of a kitchen appliance or a white appliance. The present invention may also be part of an industrial environment, for example in an industrial chain, for weighting products in the range of sub-kilograms, for example up to 500 g, e.g., up to 200 g, e.g., up to 50 g, for example up to 20 g of a product.

Within the frame of white and kitchen appliance, the appliance may be for example a coffee grinder, where the scale provides accurate measurement of the weight of the coffee beans for grinding. Alternatively, or additionally, an integrated scale provides accurate measurement of the weight of the ground coffee. This can be done during grinding, for example by monitoring the weight of ground coffee falling on the tray of the scale. The signal output can be shown on a display and/or be used by a processor, controller or actuator which can be programmed to automatically stop the grinding of coffee beans when the desired weight is reached. The high accuracy of the device allows detecting the weight of single coffee beans.

The kitchen appliance may be a brewing device. The integrated scale allows tracking the amount of product brewed. This can be coffee or tea, for example tracking coffee brewed by pressure, pour over, etc. As before, the measurement signals can be output to a display and/or be used to automatically stop brewing.

The kitchen appliance may be a cooking device, such as a kitchen robot, which can provide measurement of the weight of foodstuffs or in general ingredients in a recipe before or during the cooking process.

For instance, the scale may be arranged in a device for measuring the weight of a product for human consumption or even for animal consumption; the device may include pet feeders or the like.

The scale may be part of a white appliance such as automatic dishwashers or washing machines. The scale may be arranged to measure the amount of washing powder or washing liquid added for washing.

The range of scale and accuracy can be adapted in accordance with the specific appliance in which the scale is integrated. For example, for consumable products, the typical weights used is within few tens of grams, for example between 0 and 20 g, or 0 to 50 g, or even more, for example to 200 g or up to 500 g, or even up to 1 kg, depending on the type of appliance. For example, in the frame of coffee preparation, these ranges can be used in a scale integral to a coffee grinder or to a coffee brewer, the lower range generally being used for (but not limited to) measuring coffee beans or ground coffee, the higher range generally being used for (but not limited to) measuring brewed coffee. These are only general indications, and different ranges could be envisaged; for instance, a pressure coffee serving, usually called espresso, is usually under 30 g, so a range of 0 to 50 g or even 100 g can be used also for brewing, while the amount of coffee beans for pressure brewing is around 7 g, so a range or 0 to 20 g can be used for grinding. For weighting of washing products such as detergents, the scale design can be optimized for a range of 0 to 200 g, for example.

The scale can be designed so it is suitable at operating temperatures of up to 85° C., so it can be used even with hot products, such as freshly brewed coffee (which, in general, does not surpass 95 degrees when poured). The tray 11 may include additional insulation if required.

The weight sensor of embodiments of the present invention may provide a 1:500 dynamic range. The minimum resolvable weight increment may be about or lower than 0.2 g (the weight of one roasted coffee bean, approximately), while the full-scale weight can have a range of 100 g or even more. These numbers can be adjusted by design. The linearity error may be lower than 2.5% of full range. In some embodiments, the scale may be a standalone integrated 1D force sensor with dimensions of 5 mm×5 mm×5 mm. The scale can support common serial communication protocols (I2C and SPI) and consume about 10 mA from a 3.3V or 5V supply. The force acquisition could be triggered from the outside via an optional TRG pin. Alternatively, the sensor could be continuously measuring the force. The sensor could also be programmed to raise an interrupt signal on the INT pin (commonly known as "data ready") when a new measurement data is ready.

Figure 12:
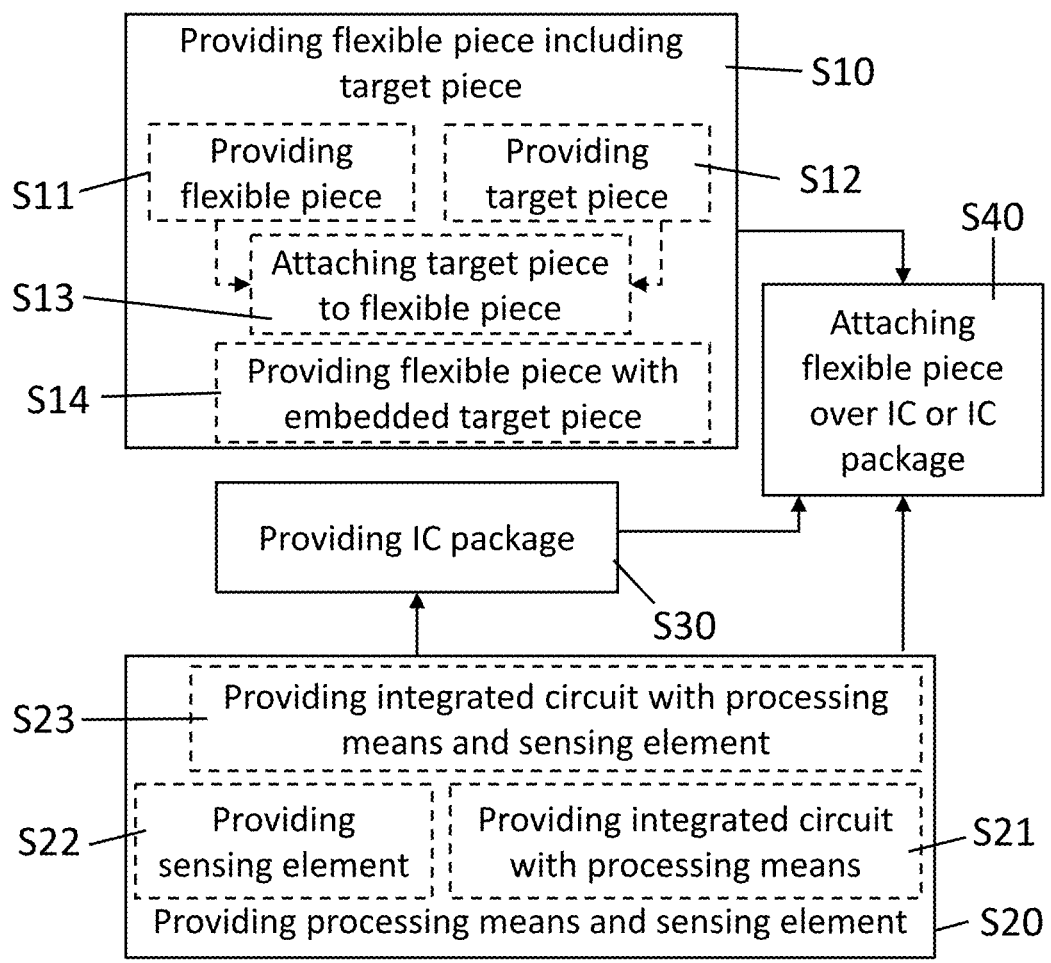
FIG. 12 is a schematic diagram of a manufacturing method of a scale in accordance with embodiments of the present invention.

In a further aspect, the present invention provides a method for manufacturing the force sensor for a scale of the first aspect of the present invention. The method can be divided in three main manufacturing steps: manufacturing the flexible piece, manufacturing the IC package, and providing the flexible piece on the IC package. FIG. 12 shows a simplified scheme for manufacturing the force sensor. The method includes providing S10 a flexible piece including the target piece, providing circuitry S20 with sensing means and processing means (such as a sensing element and an integrated processor), optionally packaging S30 the circuitry and finally providing the force sensor by attaching S40 the flexible piece including the target piece to the IC or the IC package. The method may comprise adding a container suitable for placing products to be weighted, e.g., products intended for human or animal consumption such as coffee or foodstuffs, or other products.

Providing S10 the flexible piece including the target piece may comprise integrating or embedding S14 the target piece with the flexible piece, for example by molding the flexible piece with the target piece inside the flexible material, thus completely embedding the target piece inside the flexible piece. Embedding S14 the target piece inside the flexible piece allows protection of the target against the environment and against damage from contact with the products to be weighted, from spillage of liquids, dust or the like, but the thickness between the contact surface of the flexible piece and the target should not be so large the contact forces are dampened, thus reducing sensibility.

However, the present invention is not limited thereto, and the method may include separately providing S11 the flexible piece, providing S12 the target piece, and then attaching S13 the target piece to the flexible piece, which is a simple process. This attachment can be done with adhesive, for example on the surface of the flexible piece, or without adhesive, by fitting the target piece inside an open hole in the flexible piece. The target piece may be a metal trace deposited on the surface of the elastomer, for example. The target piece may be only partially embedded, where only a part of the target piece is external (e.g., a surface of the target) while the rest of the target piece is surrounded by the flexible piece. Optionally the target piece may be further covered by a shielding layer to protect it from damages from external pieces and/or environment.

The flexibility of the piece can be chosen by choosing suitable materials, and the thickness of the flexible piece between the target and the surface to be attached to the IC package can be optimized taking into account the range of displacement (deformation) under weight, which improves with the increasing thickness, and the sensitivity of the sensing element, which drops with distance between sensing element and the target piece. Additionally, a low profile is preferred.

Providing the target may comprise providing a suitably shaped magnet or metal piece, e.g., sheet, with a resistivity such that it is suitable for inductance sensing.

Providing the flexible piece S10, S11, S14 may comprise providing an elastomeric polymer, such as silicone rubber. In some embodiments it may comprise molding, e.g., injection molding the piece in a predetermined shape and size, e.g., including a surface for attaching to a surface of the IC package without surpassing the boundaries of said surface of the IC package.

Providing S20 an IC with a processor and the sensing element may comprise separately providing S21 an integrated circuit with a processor and providing S21 a sensing element, and electrically connecting them, so the signals from the sensing element can be sent to the integrated circuit. In some embodiments, it may further comprise attaching them together, for example the sensing element may be placed on the side of the IC facing the target. In some embodiments, they may be laid out adjacent to each other, for example on a common support or frame. In alternative embodiments, the sensing element may be provided in the integrated circuit; in other words, the method may comprise providing S23 the processing means, and the sensing element integrated in the same integrated circuit IC.

Subsequently, the method may comprise optionally packaging S30 the sensing element and the processing means in the integrated circuit together, for example by overmolding both elements, thus providing a packaged integrated circuit with a sensing element and processing means for processing signals generated by the sensing element.

Packaging S30 the IC and the sensing element may comprise providing an IC package with a planar profile, where the largest surfaces are opposite to each other. The packaging may be done by orienting the sensing element, so it faces one of these largest external surfaces of the IC package, which is known in the frame of the present invention as the 'top surface' 113 as explained with reference to FIG. 4. For example, it may be closest to the top surface.

In some embodiments, packaging S30 may comprise providing an IC package by overmolding the IC and sensing element while leaving a cavity for receiving the flexible piece. The IC and/or sensing element may be only partially overmolded, so the flexible piece can be attached to the IC or sensing element of the IC package.

The flexible piece and the IC package can be attached to each other S40. The attachment of the flexible piece may be done so as to allow the maximum displacement of the target piece relative to the IC package upon contact. In some embodiments, upon attachment the IC package is oriented, so the sensing element faces the target, e.g., is closest to the target, e.g., is closest to the top surface where the flexible piece is provided. The attachment may be done with no adhesive, by interlocking elements provided in the IC package upon molding and on the flexible piece, or by addition of an adhesive layer. The attachment may be done directly on the IC or sensing element by fitting the flexible piece into a cavity provided in the mold of the IC package, as explained above. In any case, no spacer is required between the IC package and the flexible piece. Optionally, if no package is provided, the flexible piece may be provided covering the IC, attaching the piece to the IC or to a support structure of the IC.

The attachment can be done S40 so that the surface of the flexible piece is attached only to the surface of the IC package. For example, the flexible piece may not be attached to any substrate outside the IC package. In some embodiments, the shape of the elastomer and its positioning results in that the top projection of the flexible piece is confined to the area of the top surface of the package, reducing sensor footprint.

The attachment may be done so that the axis of the target piece passes through a sensing element so the sensing element will be centered. In other embodiments, the attachment may be done so that the axis does not cross any sensing element, where the sensing element is at a distance of 2 mm or less from the axis.

In embodiments of the method, the force sensor may be attached to a substrate such as a PCB, thus obtaining a force sensor assembly. The attachment may include soldering the IC package to the PCB, if present. This can be done for example after or before attaching the flexible piece on the IC package.

It is noted that the method may be adapted for the production of a scale in accordance with any of the embodiments of the first aspects. For example, the target piece and the IC package may be provided so the target piece is at least 1.5 times smaller in at least one dimension than the IC package, for example 3 times smaller, or even smaller, the at least one dimension being measured as from the top projection of the force sensor.

The invention claimed is:

1. A weight sensor comprising:
   a flexible piece provided with a target piece, the flexible piece configured for receiving a force stimulus from a product provided on the flexible piece for displacement of the target piece with respect to a sensing element;

the sensing element configured to sense changes of a magnetic field from said displacement of the target piece with respect to the sensing element and to provide a signal representative of a position of the target piece; and an integrated circuit configured for processing signals from the sensing element;

wherein the sensing element is a first sensing element, the weight sensor comprising at least one further sensing element spaced apart a predetermined distance from the first sensing element, wherein the integrated circuit is further configured to process signals from the sensing element and the at least one further sensing element, to provide a gradient of at least one component of the magnetic field and to obtain a weight of the product based on said gradient.

2. The weight sensor of claim 1, wherein the integrated circuit and the sensing element are packaged in a semiconductor package.

3. The weight sensor of claim 2, wherein the semiconductor package comprises a first surface facing the flexible piece, the first surface defining a horizontal plane parallel to the first surface, wherein the flexible piece does not extend beyond the first surface of the semiconductor package in a direction parallel to the horizontal plane.

4. The weight sensor of claim 2, wherein the flexible piece is deposited or adhered to the semiconductor package.

5. The weight sensor of claim 2, wherein the semiconductor package comprises a first surface facing the flexible piece and the flexible piece is attached to the first surface of the semiconductor package, wherein an attachment area between the flexible piece and the first surface of the semiconductor package is equal to or smaller than an area of the first surface of the semiconductor package.

6. The weight sensor of claim 2, wherein the semiconductor package comprises a first surface facing the flexible piece, the first surface defining a horizontal plane parallel to the first surface, wherein a ratio between a largest dimension of the semiconductor package in a direction parallel to the horizontal plane and a largest dimension of the target piece in the direction parallel to the horizontal plane is 1.5 or larger.

7. The weight sensor of claim 1, wherein the integrated circuit comprises a first surface facing the flexible piece, the first surface defining a horizontal plane parallel to the first surface, wherein a ratio between a largest dimension of the integrated circuit in a direction parallel to the horizontal plane and a largest dimension of the target piece in the direction parallel to the horizontal plane is 1.5 or larger.

8. The weight sensor of claim 1, wherein the first sensing element is a Hall effect-based position sensing element, and the target piece is a magnetic target piece or wherein the first sensing element is an inductive sensing element and the target piece is a conductive target piece.

9. The weight sensor of claim 1, wherein the target piece is a metallic sheet embedded in or provided on the flexible piece.

10. The weight sensor of claim 1, wherein the first sensing element is provided between the integrated circuit and the target piece.

11. The weight sensor of claim 1, wherein the first sensing element is adjacent to the integrated circuit.

12. The weight sensor of claim 1, wherein the first sensing element is integrated in the integrated circuit.

13. The weight sensor of claim 1, further comprising a temperature sensor for measuring a temperature of the weight sensor or parts thereof, for compensating temperature drifts in the signal of the first sensing element.

14. A domestic appliance comprising the weight sensor of claim 1, for measuring the weight of the product.

15. A weight sensor assembly comprising:

a force sensor, the force sensor comprising:

a flexible piece provided with a target piece, the flexible piece configured for receiving a force stimulus from a product provided on the flexible piece for displacement of the target piece with respect to a sensing element;

the sensing element configured to sense changes of a magnetic field from said displacement of the target piece with respect to the sensing element, the sensing element being configured to provide a signal representative of a position of the target piece; and an integrated circuit configured for processing signals from the sensing element and to provide readout signals based on the processed signals from the sensing element; and a support structure, wherein the force sensor is provided on the support structure including connections for rerouting readout signals generated in the force sensor to an external output.

16. The weight sensor assembly of claim 15, wherein the integrated circuit and the sensing element are packaged in a semiconductor package.

17. The weight sensor assembly of claim 16, wherein the semiconductor package comprises a first surface facing the flexible piece, the first surface defining a horizontal plane parallel to the first surface, wherein the flexible piece does not extend beyond the first surface of the semiconductor package in a direction parallel to the horizontal plane.

18. The weight sensor assembly of claim 16, wherein the flexible piece is deposited or adhered to the semiconductor package.

19. The weight sensor assembly of claim 16, wherein the semiconductor package comprises a first surface facing the flexible piece and the flexible piece is attached to the first surface of the semiconductor package, wherein an attachment area between the flexible piece and the first surface of the semiconductor package is equal to or smaller than an area of the first surface of the semiconductor package.

20. The weight sensor assembly of claim 16, wherein the semiconductor package comprises a first surface facing the flexible piece, the first surface defining a horizontal plane parallel to the first surface, wherein a ratio between a largest dimension of the semiconductor package in a direction parallel to the horizontal plane and a largest dimension of the target piece in the direction parallel to the horizontal plane is 1.5 or larger.

21. The weight sensor assembly of claim 15, wherein the integrated circuit comprises a first surface facing the flexible piece, the first surface defining a horizontal plane parallel to the first surface, wherein a ratio between a largest dimension of the integrated circuit in a direction parallel to the horizontal plane and a largest dimension of the target piece in the direction parallel to the horizontal plane is 1.5 or larger.

22. The weight sensor assembly of claim 15, wherein the sensing element is a Hall effect-based position sensing element, and the target piece is a magnetic target piece or wherein the sensing element is an inductive sensing element and the target piece is a conductive target piece.

23. The weight sensor assembly of claim 15, wherein the target piece is a metallic sheet embedded in or provided on the flexible piece.

24. The weight sensor assembly of claim 15, wherein the sensing element is provided between the integrated circuit and the target piece.

25. The weight sensor assembly of claim 15, wherein the sensing element is adjacent to the integrated circuit.

26. The weight sensor assembly of claim 15, wherein the sensing element is integrated in the integrated circuit.

27. The weight sensor assembly of claim 15, further comprising a temperature sensor for measuring a temperature of the force sensor or parts thereof, for compensating temperature drifts in the signal of the sensing element.

28. A domestic appliance comprising the weight sensor assembly of claim 15, for measuring the weight of the product.

\* \* \* \* \*